(12) United States Patent
Ogawa

(10) Patent No.: US 6,819,398 B2
(45) Date of Patent: Nov. 16, 2004

(54) EXPOSURE APPARATUS AND CONTROL METHOD THEREFOR, AND SEMICONDUCTOR DEVICE MANUFACTURING METHOD

(75) Inventor: Osamu Ogawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 10/201,245

(22) Filed: Jul. 24, 2002

(65) Prior Publication Data

US 2003/0022396 A1 Jan. 30, 2003

(30) Foreign Application Priority Data

Jul. 25, 2001 (JP) ........................................ 2001-224934

(51) Int. Cl.[7] ........................ G03B 27/42; G03B 27/32; G03C 5/00
(52) U.S. Cl. .............................. 355/53; 355/77; 430/30
(58) Field of Search ........................ 355/53, 77; 438/7; 716/21, 2; 430/22, 30

(56) References Cited

U.S. PATENT DOCUMENTS 6,331,369 B1 * 12/2001 Kawakubo et al. ........... 430/22
2002/0078429 A1 * 6/2002 Yoshida ....................... 716/21

* cited by examiner

Primary Examiner—Peter B. Kim
(74) Attorney, Agent, or Firm—Fitzpatrick, Cella, Harper & Scinto

(57) ABSTRACT

An exposure apparatus which operates based on a set of parameters contained in a parameter file. The apparatus includes an acquiring section which acquires a first parameter file containing a first set of parameters, a converting section which converts the first parameter file acquired by the acquiring section into a second parameter file containing a second set of parameters, the second set of parameters corresponding to a version of a software used in the exposure apparatus, and a setting section which sets a value of a parameter contained in the second parameter file obtained by the converting section, based on a configuration file which describes a value of the parameter contained in the second parameter file.

9 Claims, 9 Drawing Sheets

A APPARATUS

B APPARATUS

EXTERNAL MEDIUM

NETWORK

EXPOSURE APPARATUS AND CONTROL METHOD THEREFOR, AND SEMICONDUCTOR DEVICE MANUFACTURING METHOD

FIELD OF THE INVENTION

The present invention relates to an exposure apparatus and a control method therefor, and a semiconductor device manufacturing method and, more particularly, to an exposure apparatus which operates on the basis of a parameter file containing a set of parameters and a control method therefor, and a manufacturing method of manufacturing a semiconductor device using an exposure apparatus controlled by the control method.

BACKGROUND OF THE INVENTION

When a device pattern is to be projected and exposed to a wafer by a semiconductor exposure apparatus, a recipe (parameter file) for controlling the exposure process must be prepared for each device pattern. A recipe is formed from 1,000 or more parameters including layout information, alignment information, and information about exposure. Exposure apparatuses of different models require different recipes, as a matter of course. Even exposure apparatuses of the same model require difference recipes depending on the version of software.

For these reasons, a recipe for an exposing apparatus cannot be directly used for another exposure apparatus. The recipe needs to be corrected in accordance with the function and the like of another exposure apparatus. Conventionally, to use a recipe for an exposure apparatus in another exposure apparatus, the number of parameters in the recipe is increased or decreased in accordance with the function and the like of another exposure apparatus using an automatic converter, thereby reconstructing the recipe.

However, the conventional automatic recipe converter has only a function of increasing or decreasing the number of parameters. The converter cannot automatically correct the values of the generated parameters to be adapted for the function and the like of another exposure apparatus. Hence, conventionally, to convert a recipe (parameter file) for an exposure apparatus into the recipe generated by the automatic converter must be manually corrected using a recipe editor to be adapted for another exposure apparatus. Such manual correction is very time consuming. In addition, an operation error may occur.

SUMMARY OF THE INVENTION

The present invention has been made in consideration of the above situation, and has as its object, for example, in an exposure apparatus which operates on the basis of a parameter file containing a set of parameters and a control method therefor, to automatically convert a parameter file for another apparatus or a parameter file, which is not adapted for an apparatus into a parameter file adapted for the apparatus.

According to the present invention, there is provided an exposure apparatus which operates on the basis of a parameter file containing a set of parameters, comprising an acquiring section which converts the parameter file acquired by the acquiring section into a parameter file containing parameters necessary for controlling the exposure apparatus, and a changing section which changes values of parameters contained in the parameter file converted by the converting section, on the basis of a configuration file which describes the parameters necessary for controlling the exposure apparatus and appropriate values of the parameters.

According to a preferred aspect of the present invention, the converting section preferably deletes some parameters contained in the parameter file acquired by the acquiring section and/or adds parameters to the parameter file acquired by the acquiring section to generate the parameter file containing the parameters necessary for controlling the exposure apparatus.

According to a preferred aspect of the present invention, the acquiring section acquires the parameter file from e.g., an external device (e.g., another exposure apparatus or a managing apparatus for managing the parameter file). Alternatively, the acquiring section may acquire the parameter file from a memory medium.

According to the second aspect of the present invention, there is provided a control method for an exposure apparatus which operates on the basis of a parameter file containing a set of parameters, comprising the acquiring step of acquiring a parameter file, the converting step of converting the parameter file acquired in the acquiring step into a parameter file containing parameters necessary for controlling the exposure apparatus, and the changing step of changing values of parameters contained in the parameter file converted in the converting step, on the basis of a configuration file which describes the parameters necessary for controlling the exposure apparatus and appropriate values of the parameters.

According to the third aspect of the present invention, there is provided a semiconductor device manufacturing method comprising the application step of applying a photosensitive material to a substrate, the exposure step of transferring a pattern onto the substrate to which the photosensitive material is applied in the application step using an exposure apparatus controlled by the above control method, and the developing step of developing the photosensitive material on the substrate to which the pattern is transferred in the exposure step.

According to the fourth aspect of the present invention, there is provided a program which runs on a computer to generate a parameter file that contains a set of parameters and is used in an exposure apparatus, comprising the acquiring step of acquiring a parameter file, the converting step of converting the parameter file containing parameters necessary for controlling the exposure apparatus, and the changing step of changing values of parameters contained in the parameter file converted in the converting step, on the basis of a configuration file which describes the parameters necessary for controlling the exposure apparatus and appropriate values of the parameters. The computer is, e.g., a computer configured to control the exposure apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will be described below with reference to the accompanying drawings.

Figure 1:
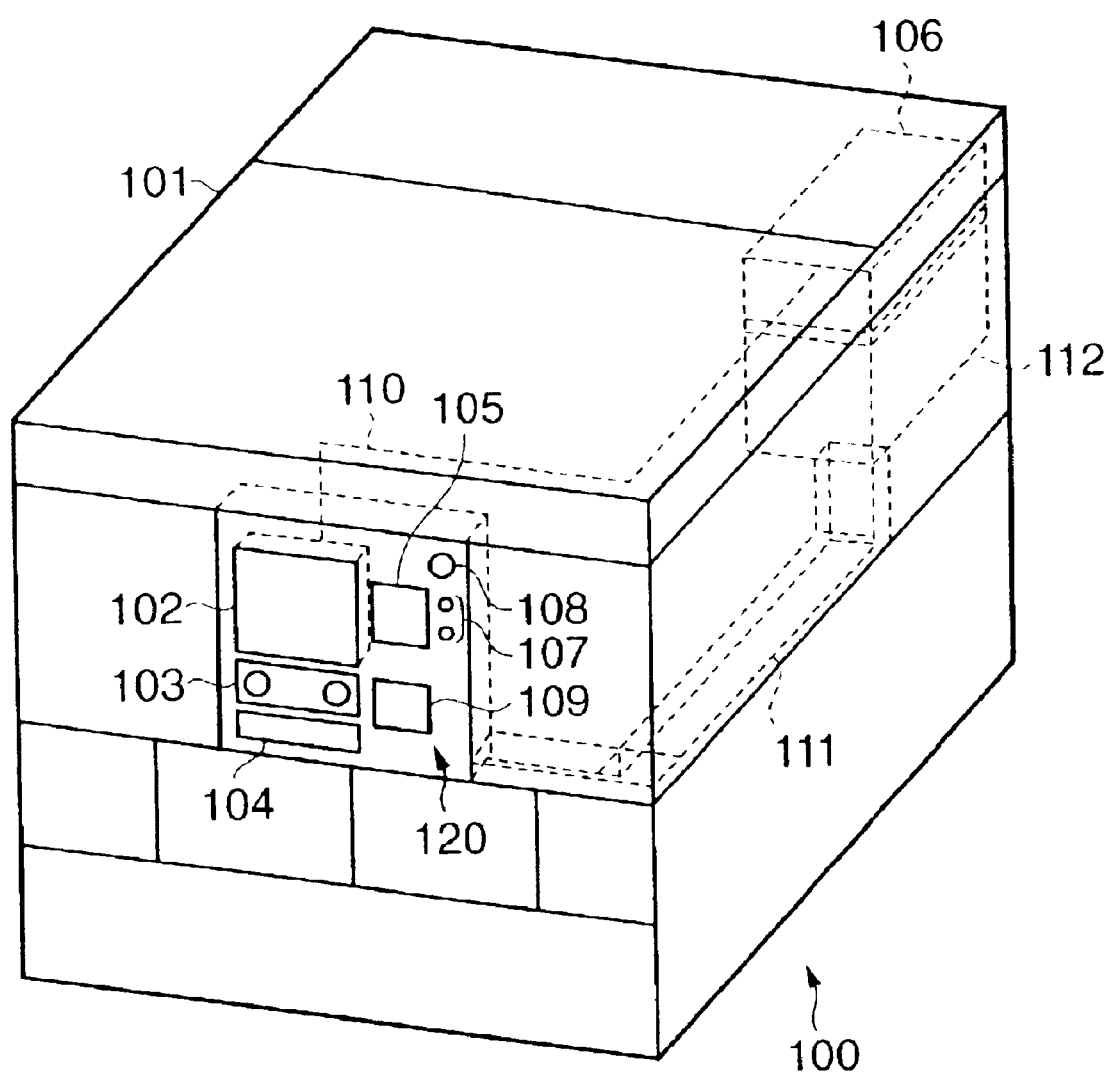
FIG. 1 is a perspective view showing the outer appearance of a semiconductor exposure apparatus according to a preferred embodiment of the present invention.

FIG. 1 is a perspective view showing the outer appearance of a semiconductor exposure apparatus according to a preferred embodiment of the present invention. A semiconductor exposure apparatus 100 comprises a semiconductor exposure apparatus main body (not shown) constituted by an illumination system, a projecting system, a stage, and the like, a temperature control chamber 101 for controlling the ambient temperature of the apparatus main body, an EWS (Engineering Work Station) main body 106 for controlling the apparatus main body, a console portion 120, an exhaust duct 111 for removing heat generated by the console portion 120 to the outside, an exhaust device 112 for exhausting the atmosphere (e.g., air) in the chamber 101, and the like. The console portion 120 has a display device 102 which is controlled by the EWS main body 106 connected through a cable 110 and displays predetermined information related to the semiconductor exposure apparatus, a monitor 105 for displaying image information obtained by an image sensing unit of the semiconductor exposure apparatus main body, an operation panel 103 used by an operator to input various kinds of information to the semiconductor exposure apparatus, an EWS keyboard 104, an ON/OFF switch 107, an emergency stop switch 108, various switches 109, and the like.

As the EWS display 102, for example, a flat display panel such as an EL display, a plasma display, or a liquid crystal display is preferably used. The display 102 is accommodated on the front surface of the chamber 101 and connected to the EWS main body 106 through the cable 110. The operational panel 103, keyboard 104, monitor 105, and the like, are also arranged on the front surface of the chamber 101.

Figure 2:
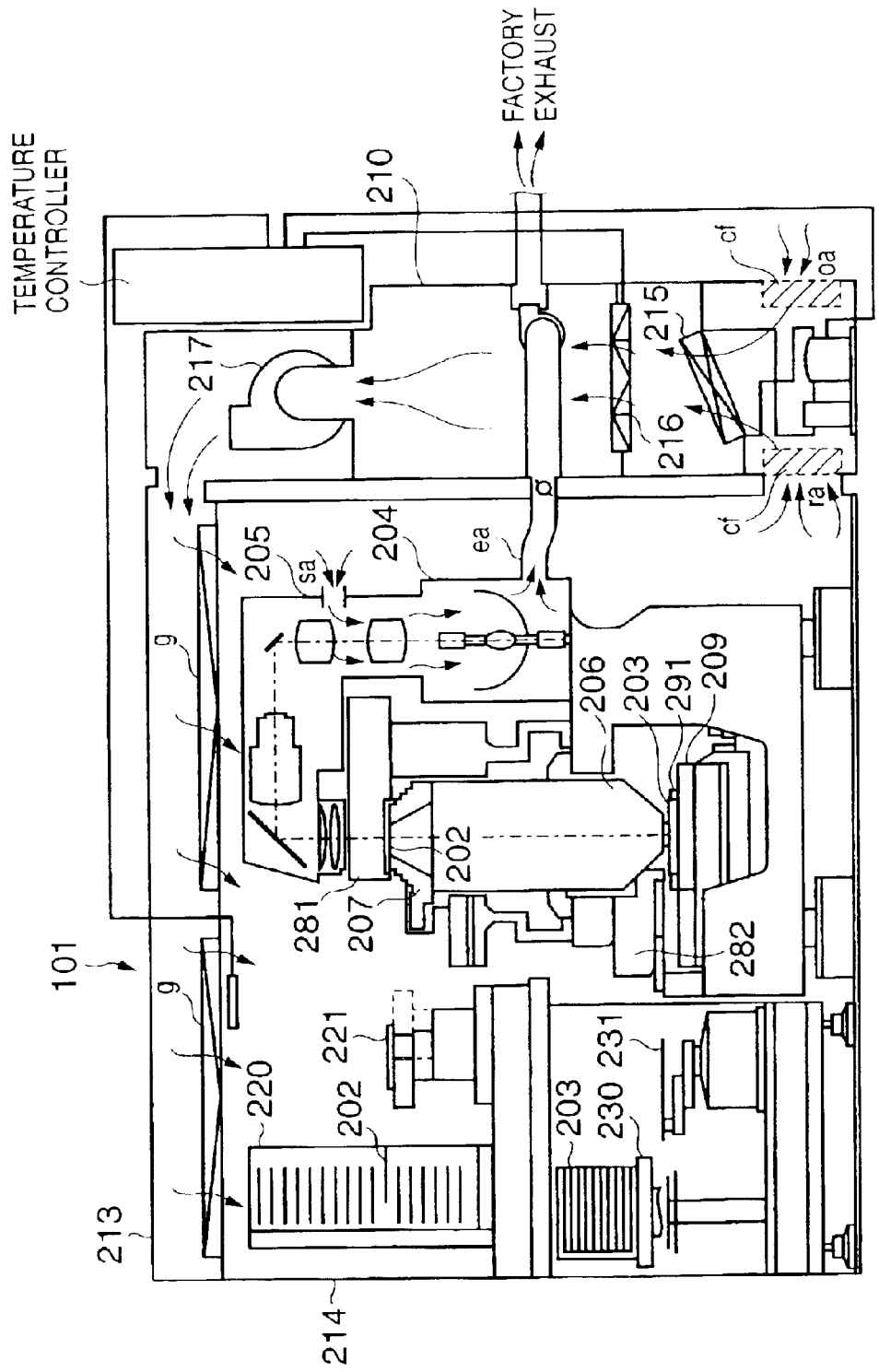
FIG. 2 is a view showing the internal structure of the semiconductor exposure apparatus shown in FIG. 1.

FIG. 2 is a view showing the internal structure of the semiconductor exposure apparatus 100 shown in FIG. 1. FIG. 2 shows a stepper (step-and-repeat semiconductor exposure apparatus) as an example of the semiconductor exposure apparatus. A light beam emitted from a light source device 204 passes through an illumination optical system 205. Then, a reticle 202 is illuminated with the light beam. The pattern of the illuminated reticle 202 is projected onto a photosensitive layer on a wafer 203 through a projecting lens 206. Thus, the pattern is transferred to the wafer 203. The reticle 202 is held by a reticle stage 207. The wafer 203 is exposed while being vacuum-checked by a wafer chuck 291. The wafer chuck 291 is driven by a wafer stage 209 to the directions of, e.g., X-, Y-, Z-, and θ-axes. A reticle optical system 281 for detecting the displacement amount of the reticle 202 is arranged above the reticle 202. An off-axis microscope 282 is arranged above the wafer stage 209 to be adjacent to the projecting lens 206. The off-axis microscope 282 is mainly used to detect the relative position between an internal reference mark and an alignment mark on the wafer 203.

A reticle library 220 and wafer carrier elevator 230 as peripheral devices are arranged adjacent to the exposure apparatus main body. A necessary reticle and wafer are transferred to the exposure apparatus main body by a reticle transfer device 221 and wafer transfer device 231.

The chamber 101 is mainly constructed by an air-conditioning room 210 for adjusting the air temperature, a filter box 213 for capturing very small foreign substances and forming a uniform flow of clean air, and a booth 214 for shielding the apparatus environment from the outside. In the chamber 101, air that is temperature-controlled by a cooler 215 and reheater 216 in the air-conditioning room 210 is supplied into the booth 214 by a blower 217 through an air filter g. The air supplied into the booth 214 is taken into the air-conditioning room 210 through a return port ra and circulated in the chamber 101. Strictly speaking, normally, the chamber 101 is not a perfect circulation system. To always keep the internal pressure in the booth 214 positive, air outside the booth 214 in an amount corresponding to about 10% of the circulated air amount is supplied through a blower from an outer air inlet oa provided in the air-conditioning room 210. In this way, the chamber 101 keeps a predetermined temperature in the environment where the semiconductor exposure apparatus main body is installed and also keeps the air clean.

The light source device 204 has an air intake ea to prepare for cooling of an ultrahigh-pressure mercury-vapor lamp or generation of a poisonous gas in the case of laser abnormality. The air in the booth 214 is partially, forcibly exhausted to the factory facility through the light source device 204 and a dedicated exhaust fan provided in the air-conditioning room 210. In addition, chemical absorption filters cf for removing chemical substances in the air are connected to the outer air inlet oa and return port ra of the air-conditioning room 210, respectively.

Figure 3:
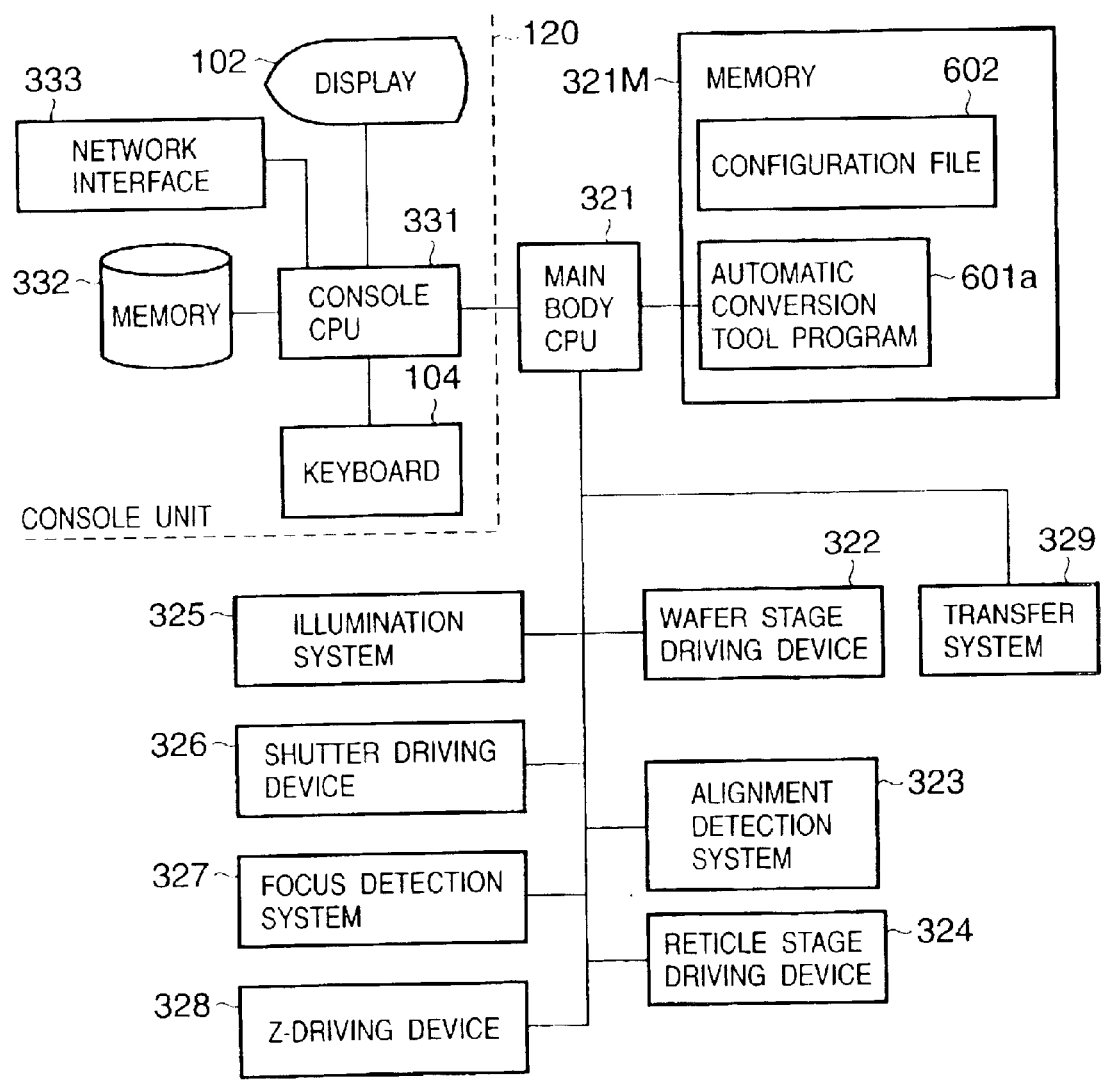
FIG. 3 is a block diagram showing the electric circuit arrangement of the semiconductor exposure apparatus shown in FIG. 1.

FIG. 3 is a block diagram showing the electric circuit arrangement of the semiconductor exposure apparatus 100 shown in FIG. 1. Referring to FIG. 3, a main body CPU 321 is incorporated in the EWS main body 106 to control the entire apparatus. The main body CPU 321 is formed from a central arithmetic processing unit such as a microcomputer or minicomputer. Reference numeral 322 denotes a wafer stage driving device; 323, an alignment detection system including the off-axis microscope 282; 324, a reticle stage driving device; 325, an illumination system including the light source device 204; 326, a shutter driving device; 327, a focus detection system; and 328, a Z-driving device. These components are controlled by the main body CPU 321. Reference numeral 329 denotes a transfer system including the reticle transfer device 221 and wafer transfer device 231. The console unit 120 having the display 102, keyboard 104, and the like, is used by the operator to supply to the main body CPU 321 various kinds of commands or parameters related to the operation of the exposure apparatus. Reference numeral 331 denotes a console CPU; 332, a memory for storing recipes (parameter files), and the like; and 333, a network interface. As a communication protocol, normally, a standard network protocol such as TCP/IP can be used.

Figure 4:
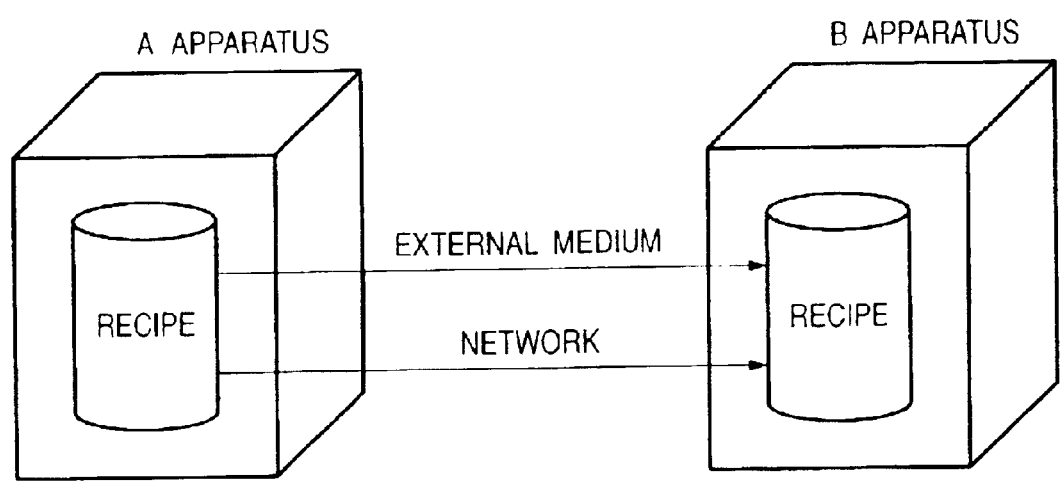
FIG. 4 is a view for explaining a problem to be solved by the present invention.

A problem to be solved by the present invention will be described again with reference to FIGS. 4 and 5. As shown in FIG. 4, to copy a recipe in an apparatus A to an apparatus B through an external medium (e.g., a floppy disk or MO) or a network and to use the recipe in the apparatus B, parameter values in the copied recipe must be corrected (changed) in accordance with a function supported by the apparatus B or its components.

This will be described using a simple example. The recipe in the apparatus A is formed from parameters 1 to 4, as indicated by a recipe 501 in FIG. 5, and values indicated in the recipe 501 are set. When this recipe is copied to the apparatus B, parameters are automatically deleted or added (increased or decreased), as indicated by a recipe 502, in correspondence with software version in the apparatus B. In the recipe 502, parameter 4 is deleted, and parameter 5 is added. A default value is given to added parameter 5. After that, the values of parameters 1 to 3 are manually rewritten using a recipe editor 503 or the like, as indicated by a recipe 504. The rewrite of parameters is indispensable when, for example, parameter 1 defines a switch for turning on/off a function and is used as OFF in the apparatus A, though it must always be used as ON in the apparatus B.

Figure 5:
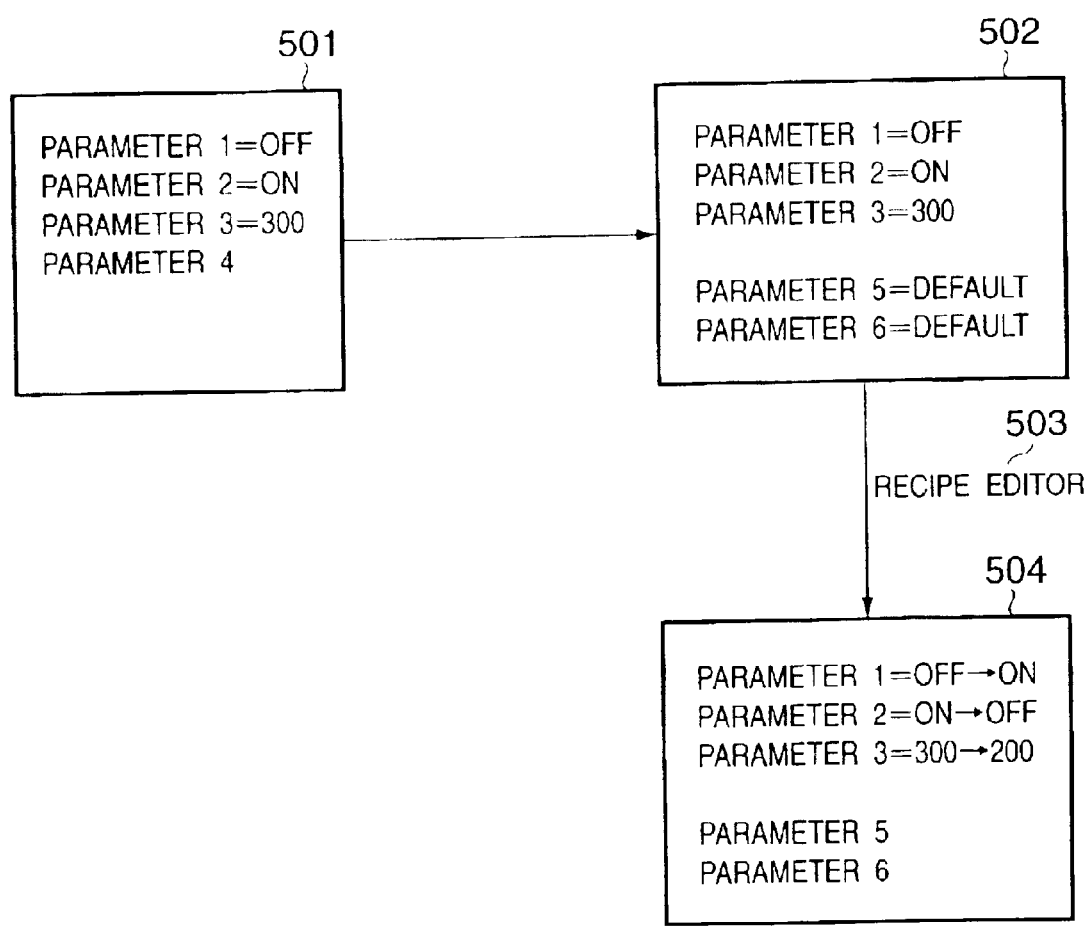
FIG. 5 is a view for explaining the flow of conventional recipe conversion.
Figure 6:
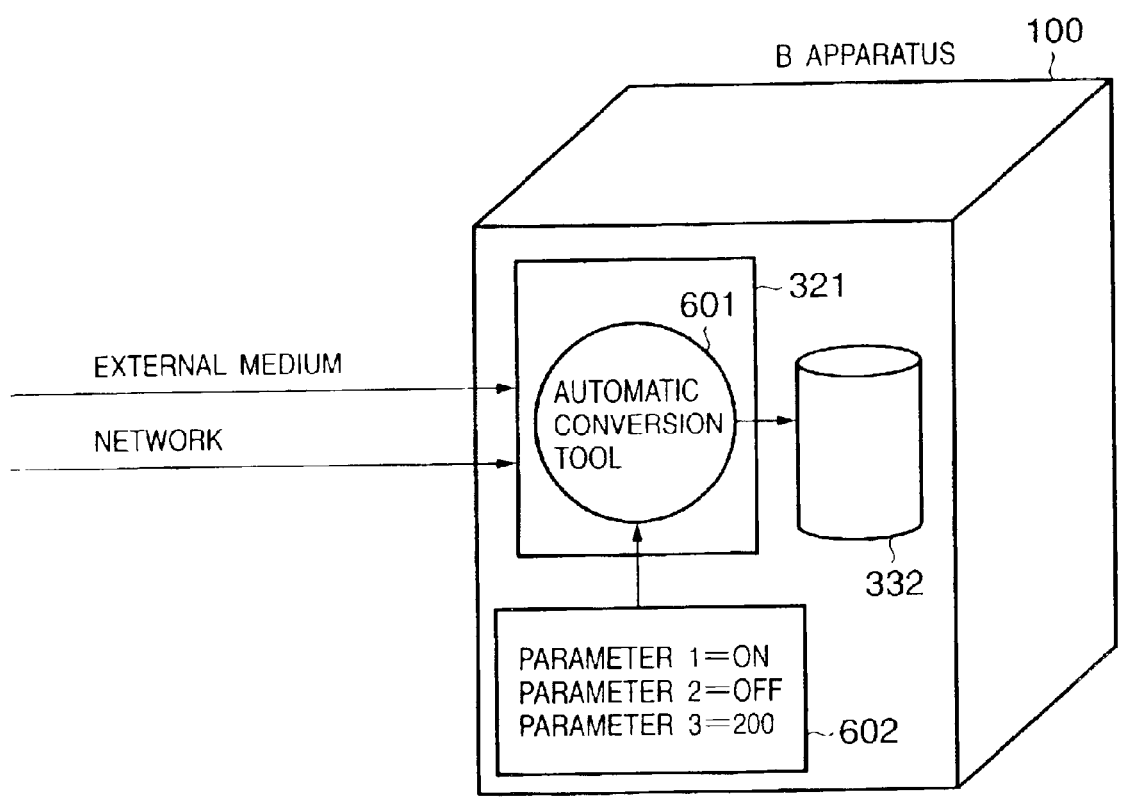
FIG. 6 is a view for explaining the recipe conversion function in the semiconductor exposure apparatus according to the preferred embodiment of the present invention.

FIG. 6 is a view for explaining the recipe conversion function in the semiconductor exposure apparatus according to the preferred embodiment of the present invention. Referring to FIG. 6, in this embodiment, when a recipe (parameter file) is to be copied to the semiconductor exposure apparatus 100 (corresponding to the apparatus B described above) through an external medium or a network, parameters are added or deleted (increased or decreased) to the original recipe by an automatic conversion tool 601 such that the recipe is adapted for the semiconductor exposure apparatus 100, thereby converting the parameter configuration. After that, the recipe is automatically changed (corrected) on the basis of a configuration file 602 and stored in the memory 332. The configuration file 602 shown in FIG. 6 describes the parameter 1 is corrected to "ON", parameter 2 is corrected to "OFF", and parameter 3 is corrected to "200". When the automatic conversion tool 601 automatically converts the original recipe (transferred recipe) on the basis of the configuration file 602, the perfect recipe 504 (i.e., a recipe adapted for the semiconductor exposure apparatus 100 serving as the apparatus B) shown in FIG. 5 is generated. The automatic conversion tool 601 can be formed by, e.g., running an automatic conversion tool program 601*a* (FIG. 3), which serves as software and is stored in a memory 321M such as a hard disk, on the main body CPU 321. In addition, the configuration file 602 is stored in, e.g., the memory 321M in advance. Instead, the automatic conversion tool 601 may be formed by hardware. The automatic conversion tool 601 and configuration file 602 may be wholly or partially provided by an external device.

Figure 7:
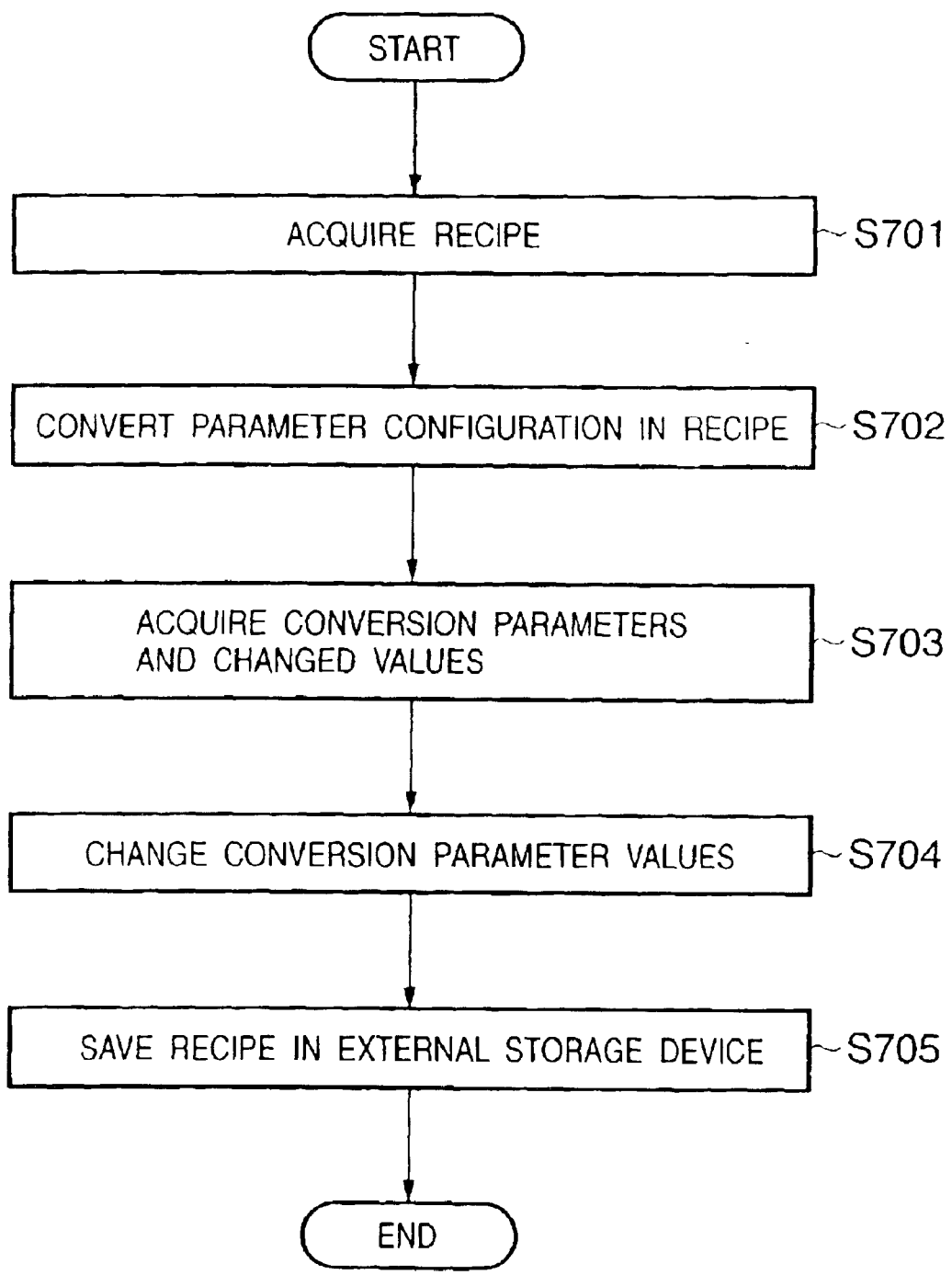
FIG. 7 is a flow chart showing the flow of processing in an automatic recipe conversion tool according to the preferred embodiment of the present invention.

FIG. 7 is a flow chart showing the flow of processing in the automatic conversion tool 601. In step S701, the automatic conversion tool 601 acquires a recipe for another exposure apparatus or a recipe which is not adapted for an apparatus (exposure apparatus 100) through an external medium or a network. In step S702, the automatic conversion tool 601 adds or deletes (increases or decreases) parameters to the recipe acquired in step S701 to convert the recipe into a parameter configuration adapted for the apparatus (exposure apparatus 100). With this conversion, a recipe having a parameter configuration adapted for the apparatus (exposure apparatus 100) is generated in terms of the types or numbers of parameters. However, the values of the parameters are not always adapted for the apparatus (exposure apparatus 100). In step S703, the automatic conversion tool 601 refers to the configuration file 602 and acquires parameters and their values for the apparatus (exposure apparatus 100). In step S704, on the basis of the acquired parameters and their values, the values of corresponding parameters in the intermediate recipe generated in step S702 are changed (corrected) to generate a recipe completely adapted for the apparatus (exposure apparatus 100). In step S705, the automatic conversion tool 601 stores the recipe completed in step S704 in the memory 332. The recipe thus stored in the memory 332 is referred to in the exposure operation to control the exposure operation.

When the automatic conversion tool 601 is formed by hardware, the automatic conversion tool 601 comprises, e.g., a recipe acquiring device (e.g., a network interface or media reader) (corresponding to step S701) for acquiring a recipe (parameter file) from an external device or medium, a conversion device (corresponding to step S702) for converting the parameter configuration in the recipe by adding or deleting parameters, a correction parameter value acquiring device (corresponding to step S703) for acquiring parameters and values corresponding to the parameters from the configuration file 602, a changing device (corresponding to step S704) for completing a recipe by changing, on the basis of the parameter values acquired by the correction parameter value acquiring device, the values of the parameters in the recipe converted by the conversion device, and a storing device (corresponding to step S705) for storing the completed recipe in an external memory. All or some of the devices may be formed in cooperation with software.

Recipes (parameter files) can generally be classified into recipes related to exposure, recipes related to reticles, recipes related to system control, and the like, and managed. The present invention can be applied to conversion of any recipe.

Additionally, in the above embodiment, a recipe is acquired from another exposure apparatus through an external medium or a network and converted into a recipe adapted for the apparatus (exposure apparatus). The apparatus of the transfer source is not limited to an exposure apparatus. It may be a file server (file management apparatus) for managing recipes.

Figure 8:
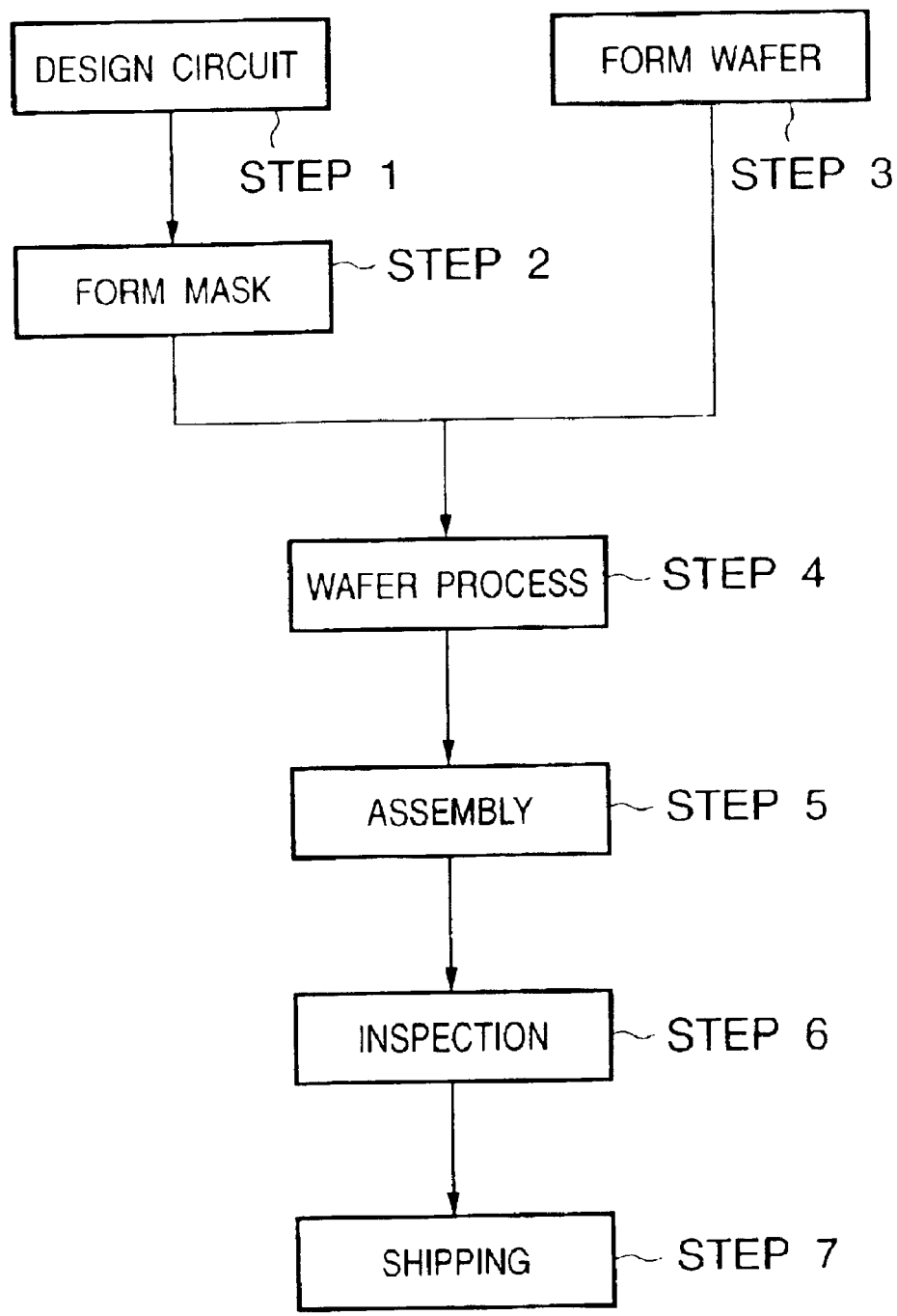
FIG. 8 is a flow chart showing the flow of an entire semiconductor device manufacturing process.

A semiconductor device manufacturing process using the above-described exposure apparatus will be explained next. FIG. 8 is a flow chart showing the flow of the whole manufacturing process of the semiconductor device. In step 1 (circuit design), a semiconductor device circuit is designed. In step 2 (mask formation), a mask is formed on the basis of the designed circuit pattern. In step 3 (wafer formation), a wafer is formed by using a material such as silicon. In step 4 (wafer process), called a pre-process, an actual circuit is formed on the wafer by lithography using the mask and wafer. Step 5 (assembly), called a post-process, is the step of forming a semiconductor chip by using the wafer formed in step 4, and includes an assembly process (dicing and bonding) and a packaging process (chip encapsulation). In step 6 (inspection), the semiconductor device manufactured in step 5 undergoes inspections such as an operation confirmation test and a durability test. After these steps, the semiconductor device is completed and shipped (step 7).

Figure 9:
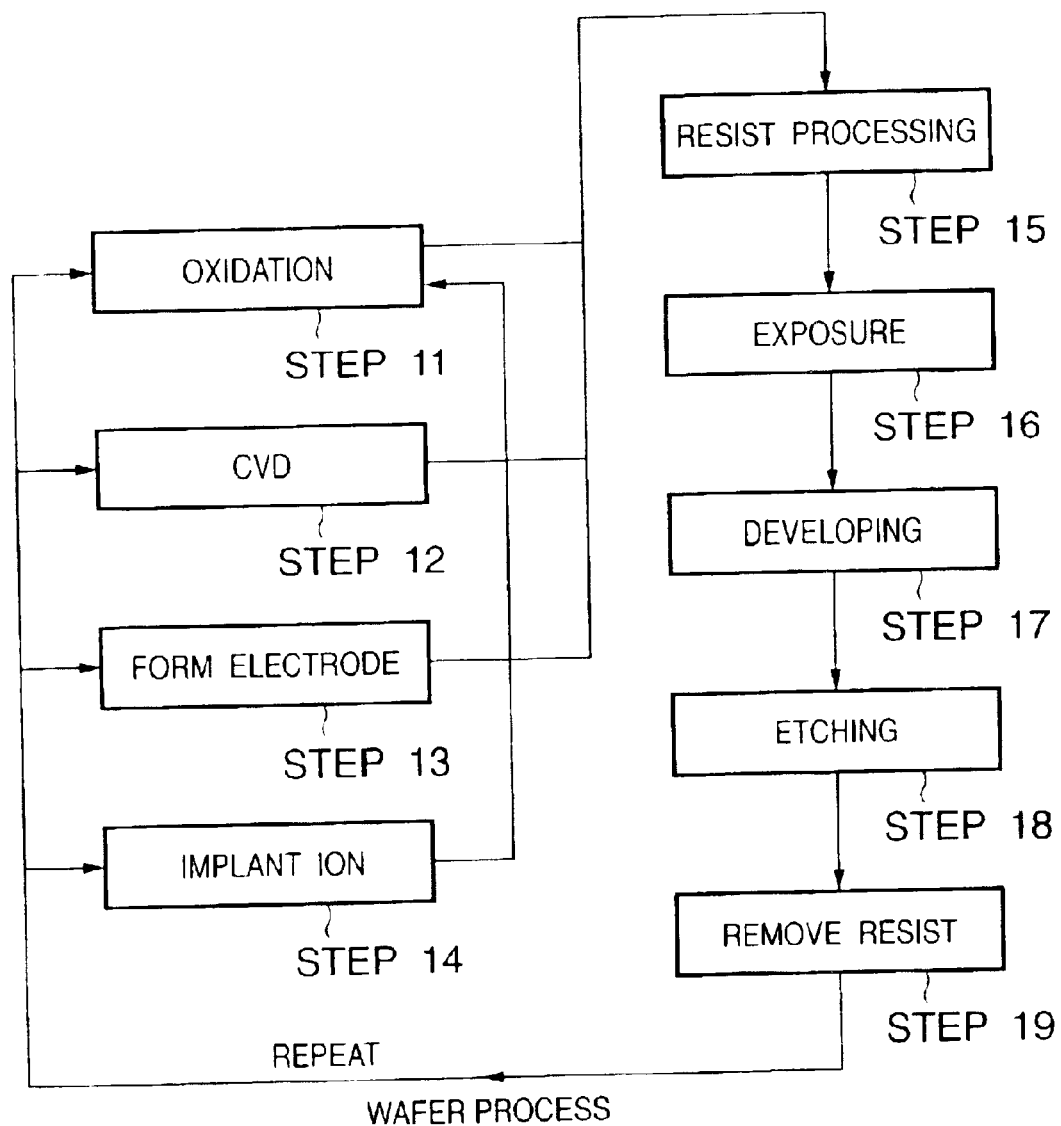
FIG. 9 is a flow chart showing a detailed flow of the wafer process shown in FIG. 8.

FIG. 9 is a flow chart showing the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer by the above-mentioned exposure apparatus. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer.

According to the exposure apparatus of the present invention and the control method therefor, a parameter file for another apparatus or a parameter file which is not adapted to an apparatus can be automatically converted into a parameter file adapted for the apparatus. Hence, load in editing a parameter file can be greatly reduced. In addition, any error caused by a manual editing operation can be prevented.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which operates based on a set of parameters contained in a parameter file, said apparatus comprising:

an acquiring section which acquires a first parameter file containing a first set of parameters;

a converting section which converts the first parameter file acquired by said acquiring section into a second parameter file containing a second set of parameters, the second set of parameters corresponding to a version of software used in said exposure apparatus; and a setting section which sets a value of a parameter contained in the second parameter file obtained by said converting section, based on a configuration file which describes a value of the parameter contained in the second parameter file.

2. An apparatus according to claim 1, wherein said converting section performs at least one of deleting a parameter contained in the first parameter file and adding a parameter to the first parameter file to generate the second parameter file.

3. An apparatus according to claim 1, wherein said acquiring section acquires the first parameter file from an external apparatus different from said exposure apparatus.

4. An apparatus according to claim 3, wherein the external apparatus is another exposure apparatus.

5. An apparatus according to claim 3, wherein the external apparatus is a managing apparatus for managing parameter files.

6. An apparatus according to claim 1, wherein said acquiring section acquires the first parameter file from an external storage medium.

7. A device manufacturing method comprising:

a step of exposing a substrate to a pattern using an exposure apparatus as recited in claim 1.

8. A parameter file generating method adapted for an exposure apparatus which operates based on a set of parameters contained in a parameter file, said method comprising steps of:

acquiring a first parameter file containing a first set of parameters;

converting the first parameter file acquired in said acquiring step into a second parameter file containing a second set of parameters, the second set of parameters corresponding to a version of software used in the exposure apparatus; and setting a value of a parameter contained in the second parameter file obtained in said converting step, based on a configuration file which describes a value of the parameter contained in the second parameter file.

9. A program which causes a computer to execute a method of generating a parameter file, the parameter file containing a set of parameters and being used in an exposure apparatus, said method comprising steps of:

acquiring a first parameter file containing a first set of parameters;

converting the first parameter file acquired in said acquiring step into a second parameter file containing a second set of parameters, the second set of parameters corresponding to a version of software used in the exposure apparatus; and setting a value of a parameter contained in the second parameter file obtained in said converting step, based on a configuration file which describes a value of the parameter contained in the second parameter file.

* * * * *